United States Patent [19]

Takase et al.

[11] Patent Number: 5,367,481
[45] Date of Patent: Nov. 22, 1994

[54] DYNAMIC RANDOM ACCESS MEMORY WITH COMPLEMENTARY BIT LINES AND CAPACITOR COMMON LINE

[75] Inventors: Satoru Takase, Yokohama; Tohru Furuyama, Tokyo, both of Japan

[73] Assignee: Kabushiki Kaisha Toshiba, Kawasaki, Japan

[21] Appl. No.: 985,114

[22] Filed: Dec. 3, 1992

[30] Foreign Application Priority Data

Dec. 26, 1991 [JP] Japan .................. 3-344700

[51] Int. Cl.$^5$ .............................. G11C 11/24
[52] U.S. Cl. .................. 365/149; 365/196; 365/203
[58] Field of Search ............ 365/203, 205, 207, 196, 365/149, 210

[56] References Cited

U.S. PATENT DOCUMENTS

| 4,598,387 | 7/1986 | Chuang et al. | 365/149 |
| 4,792,922 | 12/1988 | Mimoto et al. | 365/203 |
| 4,943,944 | 7/1990 | Sakui et al. | 365/203 |
| 5,051,954 | 9/1991 | Toda et al. | 365/189.02 |

OTHER PUBLICATIONS

Asakura, M. et al, "Cell-Plate Line Connecting Complementary Bitline (C3) Architecture for Battery Operating DRAMs", pp. 59-60, dated May 30, 1991.

Primary Examiner—Eugene R. LaRoche
Assistant Examiner—F. Niranjan
Attorney, Agent, or Firm—Banner, Birch, McKie & Beckett

[57] ABSTRACT

A DRAM comprising a memory cell array having a dynamic type memory cell having one MOS transistor for transfer gate and one capacitor for data storage with one end connected to the transistor, a word line connected in common to the gate of each transistor in each row of the memory cell array, a bit line connected in common to each transistor in each column of the memory cell array, a bit line precharge circuit provided so as to precharge the bit line of the memory cell array at a predetermined timing, a capacitor common line provided so as to correspond to a pair of complementary bit lines of the memory cell array and connected in common to the other end of the capacitor of the memory cell, a capacitor common precharge circuit provided so as to precharge the capacitor common line at predetermined timing, capacitor common line transfer gates for connecting the capacitor common line to the input nodes of a sense amplifier and on/off controlled at a predetermined timing, and bit line transfer gates for connecting the input nodes of the sense amplifier and the complementary pair of bit lines, respectively, and on/off controlled at a predetermined timing.

22 Claims, 4 Drawing Sheets

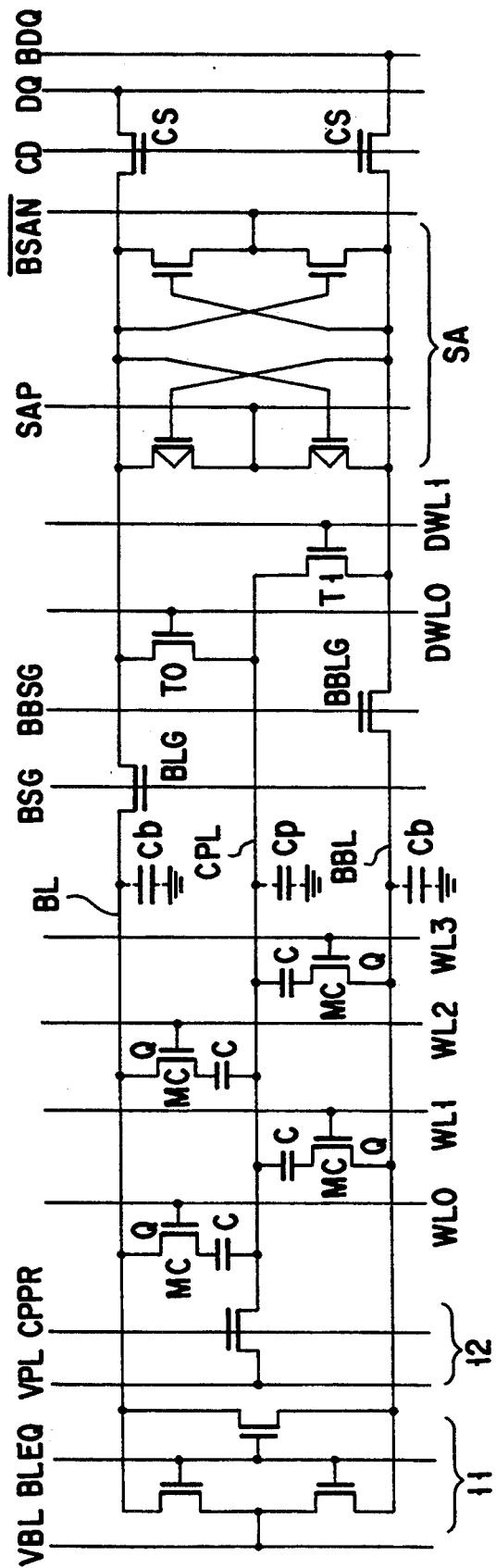
F I G. 3

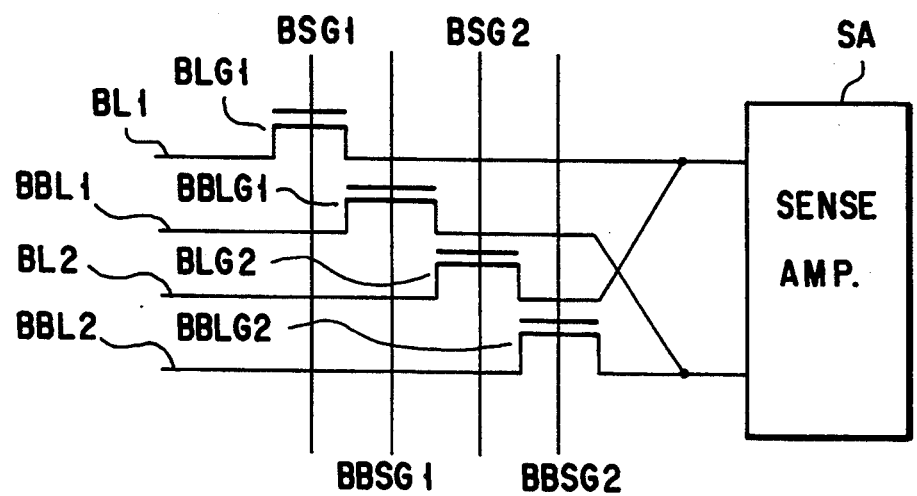
F I G. 5

DYNAMIC RANDOM ACCESS MEMORY WITH COMPLEMENTARY BIT LINES AND CAPACITOR COMMON LINE

BACKGROUND OF THE INVENTION

1. Field of the Invention

The present invention relates to a semiconductor memory device and, more particularly to a dynamic random access memory (DRAM) having a memory cell array of dynamic type memory cells formed of a MOS transistor for a transfer gate and a capacitor for data storage.

2. Description of the Related Art

FIG. 1 shows an equivalent circuit of a DRAM cell which is put to practical use at present.

This type of the DRAM cell is formed of a (insulating gate type) transistor Q for a transfer gate to be connected to a word line (WL) and a bit line (BL), and a capacitor C for data storage to be connected to the transistor Q.

For reading out data stored in the capacitor C, among electric charges stored in the capacitor C, the electric charge of a first capacitor electrode CP1 connected to the transistor Q contributes potential change to the bit line BL. Then, a bit line sense amplifier (not shown) sense-amplifies the potential difference between the potential of one bit line BL after the electric charge is moved and the potential of the other bit line which is paired with one bit line BL. In this case, among electric charges stored in the capacitor C, the electric charge of a second capacitor electrode CP2, which is opposite to the first capacitor electrode CP1, does not directly contribute the potential change to the bit line BL.

In sense-amplifying a signal read out from the DRAM cell by the bit line sense amplifier, it is possible to reduce read error of data by using larger potential difference between the bit lines.

For example, 1991 Symposium on VLSI ckts. pp. 59–60, May 30, 1991 "Cell-Plate Line Connecting Complementary Bit line (C3) Architecture for Battery Operating DRAMs" by M. ASAKURA et al discloses a DRAM using the electric charge of the second capacitor electrode (on one end of the data storage capacitor) which is opposite to the first capacitor electrode (on the other end of the data storage capacitor and connected to the transistor of the cell), so as to increase the potential change of the bit lines in reading out data from DRAM.

FIG. 2 is a circuit diagram showing a part of a memory cell array of the DRAM disclosed in the above reference.

The DRAM has a capacitor common line CPL to which the capacitor electrode on the other end of the capacitor C for the data storage of each memory cell MC of the same column in the memory cell array is connected. The common line CPL is structured so as to be selectively connected to the bit line BL or BBL of each of the paired complementary bit lines of the column. Then, in reading out data of the DRAM cell to one bit line BL, the common line CPL is connected to the other bit line BBL, thereby the potential of the bit line BBL is changed in a direction opposite to the direction of the potential change of the one bit line BL, and the potential difference, serving as an input of the bit line sense amplifier SA, between the bit line and the capacitor common line is increased.

However, in the circuit structure of FIG. 2, when the common line CPL is connected to the one bit line BBL, floating capacity Cb of the bit line BBL itself is added to floating capacity Cp of the common line CPL. In this case, the bit line capacity Cb is sufficiently large as compared with the capacitor capacity Cs of the DRAM cell. Normally, the bit line capacity Cb has the same order as the capacitor common line capacity Cp or a larger order than the capacitor common line capacity Cp. Due to this, the amount of the potential change of the common line CPL cannot be always sufficiently obtained.

SUMMARY OF THE INVENTION

It is accordingly an object of the present invention to provide a semiconductor memory device wherein the amount of signal inputted to a bit line sense amplifier is largely increased when data is read out from a DRAM cell, a sense margin of the sense amplifier can be enlarged, and a semiconductor memory cell having nigher integration can be realized.

To attain the above object, the present invention provides a DRAM comprising a memory cell array having dynamic memory cells of one transistor-one capacitor type arranged in a matrix manner; a bit line precharge circuit provided so as to precharge a bit line of the memory cell array; a capacitor common line provided so as to correspond to a pair of complementary bit lines of the memory cell array and connected to the capacitor of each memory cell; a capacitor common line precharge circuit provided so as to precharge the capacitor common line; first transfer gates connected between the capacitor common line and the paired bit lines, respectively, and on/off-controlled at a predetermined timing; a sense amplifier to which two input nodes are connected so as to correspond to each connection node between the paired bit lines and the first transfer gates; and second transfer gates connected between the input nodes of the sense amplifier and the paired bit lines, respectively, and on/off-controlled at a predetermined timing.

According to the above DRAM, when data is read out from the selected DRAM cell, an electric charge of one end of the capacitor of the selected cell is distributed to one of the pair of complementary bit lines, and the potential of one input node of the sense amplifier connected to the one bit line is changed.

Then, one of the second transfer gates, which is connected to the other bit line of the paired bit lines, is controlled to be in an OFF state. Thereafter, one of the first transfer gates, which is connected between the one of the second transfer gates and the capacitor common line, is controlled to be in an ON state. Thus, the potential of the other input node of the sense amplifier is changed in a direction opposite to the direction of the potential change of the one input node by the electric charge of the other end of the cell capacitor.

By the above operation, the potential difference generated between the input nodes of the sense amplifier is sensed by the sense amplifier. In this case, before one of the first transfer gates is controlled to be in the ON state, the one of the second transfer gates connected to the one of the first transfer gates is controlled to be in the OFF state. Therefore, the bit line floating capacity is reduced, and the amount of the signal inputted to the sense amplifier is largely increased, and the sense margin of the sense amplifier can be enlarged.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a circuit diagram showing a part of a memory cell array of a DRAM according to a first embodiment of the present invention;

FIG. 5 is a circuit diagram showing a part of a DRAM of a shared sense amplifier system to which the present invention is applied.

DETAILED DESCRIPTION OF THE PREFERRED EMBODIMENTS

Figure 1:
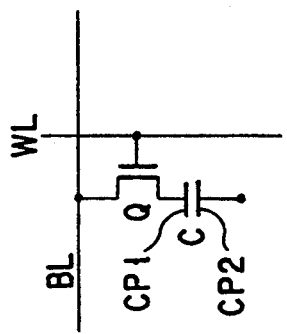
FIG. 1 is a circuit diagram showing a conventional DRAM cell of one transistor-one capacitor type.
Figure 2:
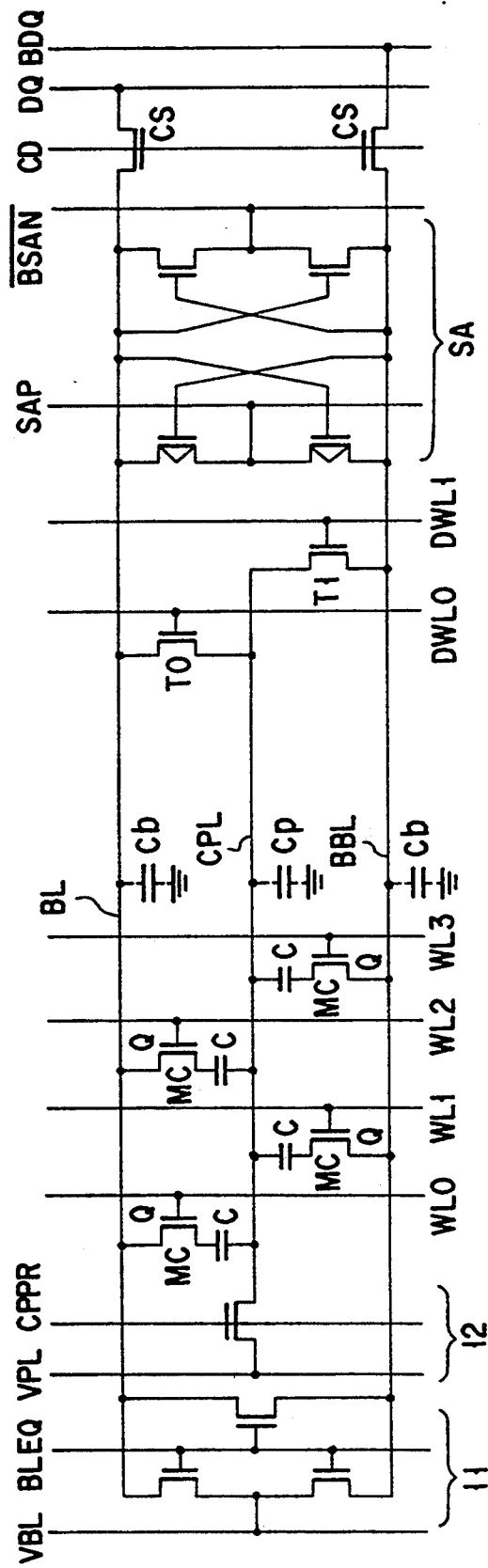
FIG. 2 is a circuit diagram showing a part of a memory cell array of the conventional DRAM.

Embodiments of the semiconductor device of the present invention will be explained with reference to the drawings. In the following explanation, the same reference numerals are used in the common portions through the whole drawings, and the repetition of the explanation of the same reference numerals is omitted.

FIG. 3 is a circuit diagram showing a part of a memory cell array of a DRAM according to a first embodiment of the present invention.

In the memory cell array, DRAM cell MCs of one transistor Q-one capacitor C type shown in FIG. 1 are arranged in a matrix manner. A word line (WL0, WL1, WL2, WL3, . . . are typically shown) is connected in common to each gate of the MOS transistor Q of the memory cell of the same row. A bit line (a pair of complementary bit lines BL and BBL is typically shown) is connected in common to each end of the MOS transistor Q of the memory cell of the same column. In this case, the memory cell array has a folded bit line structure.

Reference numeral 11 is a bit line precharging and equalizing circuit connected to the pair of complementary bit lines BL and BBL of the memory cell array. BLEQ is a bit line precharge equalizing signal on/off-controlling the bit line precharging and equalizing circuit 11. VBL is a bit line precharge potential.

It is noted that the equalizing circuit section is often omitted in the bit line precharging and equalizing circuit 11.

CPL is a capacitor common line, which is provided to correspond to the paired complementary bit lines BL and BBL, and is connected in common to each other end (plate electrode) of the capacitor C of each memory cell connected to the paired complementary bit lines BL and BBL.

Reference numeral 12 is a capacitor common line precharging circuit connected to the capacitor common line CPL. CPPR is a capacitor common line precharge signal on/off controlling the capacitor common line precharging circuit 12. VPL is a capacitor common line precharge potential.

T0 and T1 are first transfer gates which are respectively connected between the capacitor common line CPL and the paired bit lines BL and BBL, and which are on/off-controlled at a predetermined timing.

The first transfer gates T0 and T1 are independently controlled by dummy word line selection signals, which are respectively supplied from dummy word lines DWL0 and DWL1.

SA is a sense amplifier having two input nodes, which are respectively connected to the other end of each of two first transfer gates T0 and T1.

The sense amplifier SA of this embodiment comprises an NMOS sense amplifier for sensing operation and a PMOS sense amplifier for restoring operation. A latch type amplifier having a pair of input/output nodes is used in this embodiment.

/BSAN is a signal for controlling the operation of the NMOS sense amplifier, and its active level is in an "L" state.

SAP is a signal for controlling the operation of the PMOS sense amplifier, and its active level is in a "H" state.

BLG and BBLG are second transfer gates which are respectfully connected between input nodes of the sense amplifier SA and the paired bit lines BL and BLL. The second transfer gates BLG and BBLG are on/off independently controlled at a predetermined timing by bit line switch gate control signals BSG and BBSG.

CS is a column selection switch controlled by an output CD of a column decoder (not shown). DQ and BDQ are complementary data lines, which are connected between the column selection switch CS and a data input/output circuit (not shown), and which transmit reading data and writing data. The data lines DQ and BDQ may be used as both an input data line and an output data line or divided into the input data line and the output data line.

It is noted that word lines WL0, WL1, WL2 . . . and dummy word lines DWL0, DWAL1 are driven by a word line driving circuit (not shown) and a dummy word line driving circuit (not shown).

Moreover, the capacitor common line CPL is independently formed for every paired complementary bit lines BL and BBL of the memory array, and, for example, formed as a layer which is lower than the paired bit lines.

Figure 4:
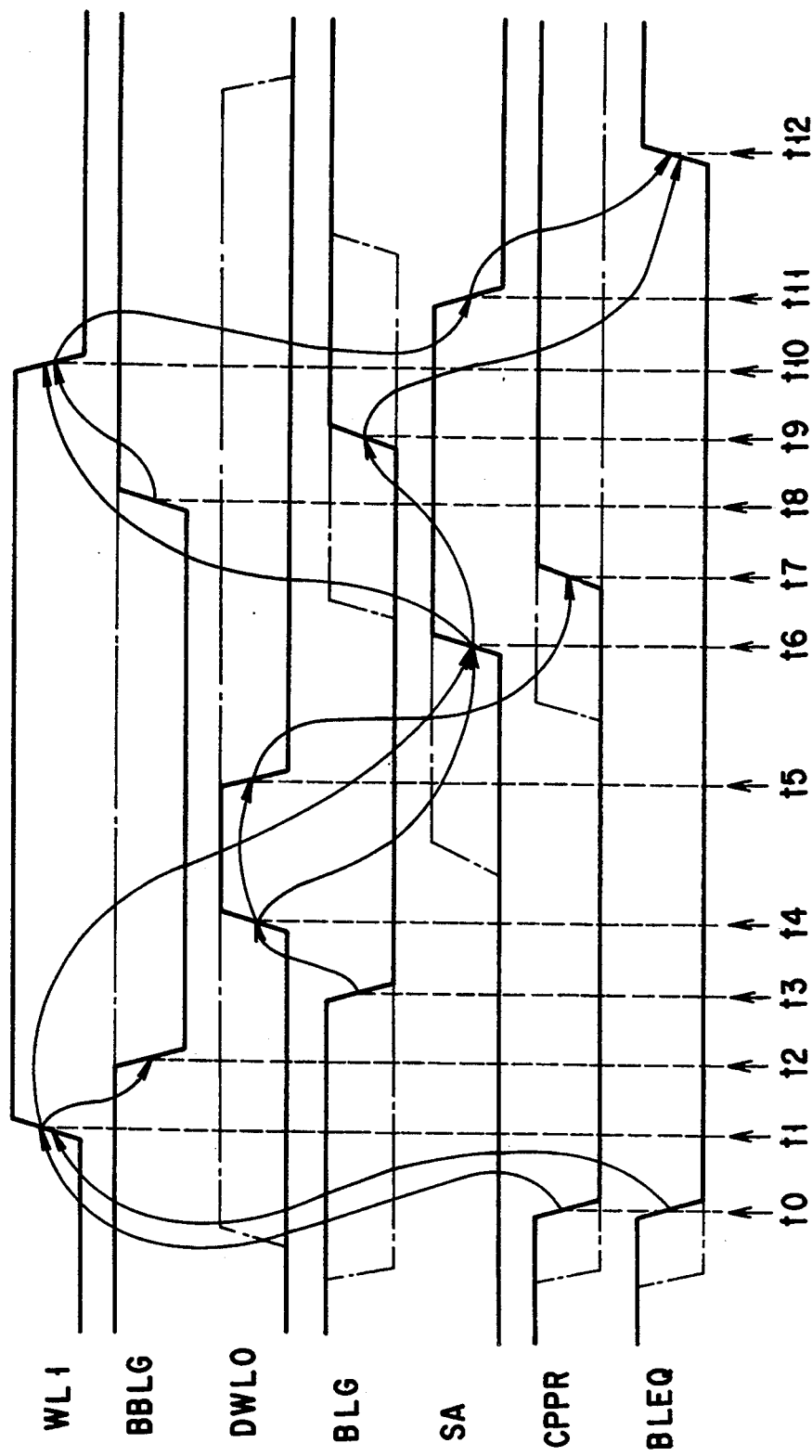
FIG. 4 is a voltage waveform view showing one example of an operation timing of each part so as to explain the operation of the DRAM of FIG. 3.

FIG. 4 is a voltage waveform view showing one example of an operation timing of each part to explain the reading and writing operations of the memory cell MC at the time of selecting, for example, the word line WL1 of the DRAM of FIG. 3.

Prior to time t0, the bit line precharging and equalizing circuit 11 and the capacitor common line precharge circuit 12 are respectively controlled to be in an ON state. The pair of bit lines BL and BBL and the capacitor common line CPL are respectively precharged to potentials VBL, VPL (it is normally set that VBL=VPL). The first transfer gates T0, T1 are respectively controlled to be in an OFF state. The second transfer gates BLB, BBLG are respectively controlled to be in an ON state.

At time t0, the bit line precharging and equalizing circuit 11 and the capacitor common line precharge circuit 12 are respectively controlled to be in an OFF state. In this case, the bit line precharging and equalizing circuit 11 and the capacitor common line precharge circuit 12 are independently on/off-controlled. This embodiment shows that case that the bit line precharging and equalizing circuit 11 and the capacitor common line precharge circuit 12 are controlled to be in the OFF state at the same timing.

At time t1, the word line WL1 is activated, the transistor Q of the memory cell to be selected is turned on, and data stored in the capacitor C is read to one bit line BBL. Then, a potential change occurs in one input node of the sense amplifier SA which is connected to one bit line BLL through transfer gate BBLG.

At time t2, transfer gate BBLG is controlled to be in an OFF state, and one bit line BBL is electrically separated from the one input node of the sense amplifier SA. At time t3, transfer gate BLG, which is connected to the other bit line BL, is controlled to be in an OFF state, and the other bit line BL is electrically separated from the other input node of the sense amplifier SA. Thereby, the bit line floating capacity in a state that the memory cell as seen from the sense amplifier is reduced.

At time t4, the dummy word line DWLO is activated, and transfer gate T0, which is connected between the other bit line BL and the capacitor common line CPL, is controlled to be in an ON state. Thus, the electric charge of the other end of the capacitor C of the selected memory cell MC is transmitted to the other input node of the sense amplifier SA through transfer gate T0, and the potential of the other input node is changed in a direction opposite to the direction of the potential change of the one input node.

At time t5, the dummy word line DWL0 is set to be in a non-activate state, and the capacitor common line CPL is electrically separated from the other input node of the sense amplifier SA.

At time t6, the sense amplifier control signal/BSAN and SAP are respectively activated and the sense amplifier SA is operated, and the sense amplifier SA sense-amplifies the potential difference between the pair of the input nodes. A pair of output nodes of the sense amplifier SA is reserved to be a complementary potential (power supply ply potential VCC and ground potential 0V).

At time t7, the capacitor common line precharge circuit 12 is controlled to be in an ON state, and the capacitor common line CPL is precharged to potential VPL, and fixed.

At time t8, transfer gate BBLG connected to the one bit line BBL, which is connected to the selected memory cell, is controlled to be in an ON state.

At time t9, transfer gate BLG connected to the other bit line BL is controlled to be in an ON state.

As explained above, the second transfer gates BBLG and BLG are respectively controlled to be in the ON state, so that the output data of the sense amplifier SA is rewritten to the memory cell MC which is in a selection state.

At time t10, the word line WL1 is set to be in a non-activate state, the transistor Q of the memory cell MC is turned off and data to be stored in the capacitor is reserved.

At time t11, the sense amplifier control signal/BSAN and SAP are respectively non-activated, and the operation of the sense amplifier SA is ended.

At time t12, the bit line precharging and equalizing circuit 11 is controlled to be in an ON state, and the precharging and equalizing operations of the paired bit lines BL and BBL are started, and the paired bit lines BL and BBL are precharged and equalized to the potential VBL.

In other words, in the DRAM of FIG. 3, in reading data from the selected DRAM cell, the electric charge of one end of the capacitor C of the selection cell is distributed to the capacity of one bit line BBL of the paired complementary bit lines, and the potential of one input node of the sense amplifier SA connected to the one bit line BBL is changed.

Thereafter, transfer gate BBLG connected to the one bit line BBL is controlled to be in an OFF state.

On the other hand, after transfer gate BLG connected to the other bit line BL of the paired bit lines is controlled to be in an OFF state, the first transfer gate T0 connected between the second transfer gate BLG and the capacitor common line CPL is controlled to be in an ON state. Thereby, the potential of the BLG, which is connected to the other bit line BL of the paired bit lines, is controlled to be in an OFF state, transfer gate T0, which is connected between transfer gate BLG and the capacitor common line CPL, is controlled to be in an ON state. Thus, the potential of the other input node of the sense amplifier SA is changed in a direction opposite to the direction of the potential change of the one input node.

By the above operation, the potential difference generated between of the input nodes of the sense amplifier SA is sensed by the sense amplifier SA.

In this case, before the sensing operation of the sense amplifier SA is started, the second transfer gates BBLG and BLG are controlled to be in an OFF state and the bit line floating capacity as seen from the sense amplifier is reduced.

Therefore, the amount of signal inputs of the sense amplifier can be largely increased, and the sense margin of the sense amplifier SA can be enlarged.

Moreover, since the bit line floating capacity as seen from the sense amplifier is reduced before the sensing operation of the sense amplifier SA is started, the speed of the sensing operation of the sense amplifier SA can be enhanced.

Furthermore, since the sense amplifier SA charges/discharges the bit lines BL and BBL only when the output data is rewritten (or written) to the capacitor C of the memory cell MC, a low power consumption can be obtained.

According to the DRAM of FIG. 3, in reading data from the DRAM cell, the amount of signal inputted to of the sense amplifier can be largely increased, and the sense margin of the sense amplifier SA can be enlarged, so that the semiconductor memory device having high reliability can be realized.

Moreover, even if the capacity of the cell capacitor is reduced and a ratio of the capacity of the bit lines to the capacity of the cell capacitor is increased so as to increase the number of bits per bit line in accordance with the case that the capacity of the cell array is enlarged, the amount of signal inputted to the sense amplifier can be largely increased as compared with the conventional case when data is read from the DRAM cell.

Therefore, the DRAM cell having high integration can be realized, and cost per bit can be largely reduced. Also, the DRAM cell can be used in substitution for a recording medium such as a magnetic disc. These points are very useful for realizing the DRAM having a large capacity with low cost.

In FIG. 4, a one dotted chain line shows one example of variable tolerance of each timing. More specifically, the order of time t0 and time t1, the order of time t1 and t2, and the order of time t3 and t4 must be satisfied. However, the order of time t1 and time t3 and the order of time t2 and time t3 may be the same or inverted.

Also, it is possible to omit the operation in which transfer gate BBLG is controlled to be in an off state at time t2.

The order of time t1 and time t6, the order of time t6 and t8, and the order of time t6 and t9 must be satisfied. However, the order of time t6 and time t7 may be the same or inverted.

The order of time t5 and time t6 may be the same or inverted, and the order of time t7, time t8 and time t9 may be the same or inverted.

The order of time t8, time t9 and time t10, the order of time t9 and t12, the order of time t10 and t11, and the order of time t11 and t12 must be satisfied. However, the order of time t9 and time t11, the order of time t5, time t7 and time t12 are the same or inverted.

In the above embodiment, in the writing operation, writing data is supplied to the bit lines BL and BBL from a data writing circuit (not shown) through the data lines DQ and BDQ at the timing of the the rewriting as explained above, and the bit lines BL and BBL may be set to the complementary potential (power supply potential VCC and ground potential 0V).

Moreover, a differential type amplifier, which is connected to two connection nodes corresponding to the pair of the input nodes respectively, may be used as the sense amplifier SA. Then, a rewriting potential may be set to the bit lines BL and BBL by the data writing circuit (not shown) based on the output of the sense amplifier. In this case, the second transfer gates BLG and BBLG may be on/off-controlled by a common control signal.

Furthermore, a bit line precharging circuit (not shown) and a bit line equalizing circuit (not shown) are connected between the pair of input nodes of the sense amplifier from the second transfer gates BLG and BBLG, and may be on/off-controlled by a bit line precharge signal BLEQ. In this case, the bit line precharge using the bit line precharging and equalizing circuit 11 may be omitted.

The capacitor common line CPL is not limited to use as a line of a layer, which formed below the bit lines. By use of the technique disclosed in "A New Stacked Capacitor DRAM Cell Characterized by a Storage Capacitor on a Bit line Structure" by S. Kimura et al, IEDM 1988, pp. 596–598, the capacitor common line CPL may be used as a line of a layer, which formed above the bit lines.

FIG. 5 is a circuit diagram showing of a layer, which is lower than the bit lines of a DRAM of a shared sense amplifier system to which the present invention is applied.

The DRAM having a cell array of the folded bit structure shown in FIG. 3 is applied to a shared sense amplification system in which a plurality of pairs of the paired bit lines and the corresponding capacitor common lines share one sense amplification.

In this case, (BL1, BBL1) are a first pair of bit lines, (BLG1, BBLG1) are transfer gates connected between the bit lines (BL1, BBL1) and the sense amplifier SA, and controlled by control signals (BSG1, BBSG1).

(BL2, BBL2) are a second pair of bit lines, (BLG2, BBLG2) are transfer gates connected between the bit lines (BL2, BBL2) and the sense amplifier SA, and controlled by control signals (BSG2, BBSG2).

The control signals (BSG1, BBSG1) and (GSG2, BBSG2) control two pairs of bit lines to be selectively electrically connected to one sense amplifier SA.

The present invention can be applied to a DRAM of a shared sense amplification system having a cell array of an open bit line structure.

The above embodiments detailed in the specification and the drawing do not limit the present invention. Various modifications may be made without departing from the sprit and scope of the invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
   memory cells each including a transfer transistor and a data storage capacitor having a first electrode connected to a first terminal of said transfer transistor;
   word lines each connected to a control terminal of one of said transfer transistors;
   a bit line pair comprising first and second bit lines, wherein second terminals of said transfer transistors are connected to one of said first and second bit lines;
   a capacitor common line connected to second electrodes of said data storage capacitors;
   a sense amplifier having first and second input nodes;
   capacitor common line transfer gates, a first of said capacitor common line transfer gates connected between said capacitor common line and said first input node of said sense amplifier and a second of said capacitor common line transfer gates connected between said capacitor common line and said second input node of said sense amplifier;
   bit line transfer gates, a first of said bit line transfer gates connected between said first bit line and said first input node of said sense amplifier and connected to said first of said capacitor common line transfer gates, and a second of said bit line transfer gates connected between said second bit line and said second input node of said sense amplifier and connected to said second of said capacitor common line transfer gates; and
   read/write control circuitry for controlling reading and writing of data to said memory cells, said control circuitry including first means for supplying selection signals to said word lines, second means for supplying selection signals to switch said capacitor common line transfer gates, third means for supplying selection signals to switch said bit line transfer gates, and fourth means for supplying signals that activate/deactivate said sense amplifier;
   wherein, when reading data from one of said memory cells,
   said fourth means supplies signals to deactivate said sense amplifier,
   subsequently said second means switches said capacitor common line transfer gates OFF, subsequently said first means supplies a selection signal to one of said word lines, subsequently, or before said first means supplies the selection signal, said third means switches one of said first and second bit line transfer gates OFF, subsequently said second means switches one of said first and second capacitor common line transfer gates connected to said one of said first and second bit line transfer gates ON, subsequently said second means switches said one of said first and second capacitor common line transfer gates OFF, subsequently said fourth means supplies signals to activate said sense amplifier.

2. The semiconductor memory device according to claim 1, wherein said second means for supplying selection signals to said capacitor common line transfer gates operates independently from said third means for supplying selection signals to said bit line transfer gates.

3. The semiconductor memory device according to claim 1, wherein said third means supplies selection signals for independently switching said bit line transfer gates.

4. The semiconductor memory device according to claim 2, wherein said third means supplies selection signals for independently switching said bit line transfer gates.

5. The semiconductor memory device according to any one of claims 1 to 4, wherein said sense amplifier is a latch type amplifier.

6. The semiconductor memory device according to any one of claims 1 to 4, wherein said sense amplifier comprises a differential amplifier and a data writing circuit for setting a rewriting potential to said first and second bit lines based on a sense output of said differential amplifier.

7. The semiconductor memory device according to claim 1, wherein said semiconductor device includes a plurality of said paired bit lines, a corresponding plurality of capacitor common lines, a corresponding plurality of said capacitor common line transfer gates connected between said capacitor common lines and input nodes of a shared sense amplifier, and a corresponding plurality of said bit line transfer gates connected between said paired bit lines and said input nodes of said shared sense amplifier, and said second means and third means supply selection signals to selectively connect said paired bit lines and said capacitor common lines to said input nodes of said shared sense amplifier.

8. The semiconductor memory device according to claim 1 further comprising bit line precharging circuitry for precharging said bit pair to a first predetermined potential.

9. The semiconductor memory device according to claim 1 further comprising capacitor common line precharge circuitry for precharging said capacitor common line to a second predetermined potential.

10. The semiconductor memory device according to claim 8 further comprising capacitor common line precharge circuitry for precharging said capacitor common line to a second predetermined potential.

11. The semiconductor memory device according to any one of claims 9 and 10, wherein, prior to data being written to a memory cell, said capacitor common line precharge circuitry is controlled to be in an ON state and said capacitor common line is precharged to said second predetermined potential.

12. The semiconductor memory device according to claim 10, wherein said first predetermined potential of said bit line precharging circuitry is equal to said second predetermined potential of said capacitor common line precharging circuitry.

13. The semiconductor memory device according any one of claims 10 and 12, wherein said bit line precharging circuitry and said capacitor common line precharging circuitry are on/off controlled independently of each other.

14. The semiconductor memory device according to claim 13, wherein, when data is read from a memory cell, said bit line precharging circuitry and said capacitor common line precharging circuitry are controlled to be in an ON state at the same time, and controlled to be in an OFF state at the same time.

15. The semiconductor memory device according to claim 1, wherein said capacitor common line is formed as a line in a layer which is formed above said paired bit lines.

16. The semiconductor memory device according to claim 1, wherein said capacitor common line is formed as a line in a layer which is formed below said paired bit lines.

17. The semiconductor memory device according to claim 1, wherein, when rewriting data to a memory cell, said first means supplies a selection signal to select one of said word lines, subsequently said fourth means supplies signals to activate said sense amplifier, subsequently said third means switches said bit line transfer gates connected to said first and second bit lines ON, subsequently said first means clears a selection signal to one of said word lines, subsequently said fourth means supplies signals to deactivate said sense amplifier.

18. The semiconductor memory device according to claim 1, wherein, when data is written to the memory cell, said first means supplies a selection signal to select one of said word lines, subsequently said third means switches said bit line transfer gates connected to said first and second bit lines ON, subsequently said first means supplies a selection signal to deselect said one of said word lines.

19. The semiconductor memory device according to claim 1 wherein said second means supplies selection signals for independently switching said capacitor common line transfer gates.

20. The semiconductor memory device according to claim 2 wherein said second means supplies selection signals for independently switching said capacitor common line transfer gates.

21. The semiconductor memory device according to claim 19 wherein said sense amplifier is a latch type amplifier.

22. The semiconductor memory device according to claim 1, further comprising capacitor common line precharge circuitry for precharging said capacitor common line to a predetermined potential; and wherein, when rewriting data to a memory cell,
said first means supplies a selection signal to select one of said word lines,
said fourth means subsequently supplies signals to activate said sense amplifier,
said capacitor common line precharge circuitry subsequently is controlled to be in an ON state,
said third means subsequently switches said bit line transfer gates connected to said first and second bit lines ON,
said first means subsequently clears a selection signal to one of said word lines, and
said fourth means subsequently supplies signals to deactivate said sense amplifier.

* * * * *